United States Patent [19]
Komori

[11] Patent Number: 6,087,071
[45] Date of Patent: Jul. 11, 2000

[54] PROCESS FOR INCREASING THERMOSTABILITY OF A RESIST THROUGH ELECTRON BEAM EXPOSURE

[75] Inventor: Minoru Komori, Yokohama, Japan

[73] Assignee: Ushiodenki Kabushiki Kaisha, Tokyo, Japan

[21] Appl. No.: 09/394,346

[22] Filed: Sep. 13, 1999

[30] Foreign Application Priority Data

Sep. 11, 1998 [JP] Japan .................................. 10-258996

[51] Int. Cl.$^7$ ...................................................... G03C 5/00
[52] U.S. Cl. .......................... 430/296; 430/328; 430/330; 430/942
[58] Field of Search .................................. 430/296, 328, 430/330, 942

[56] References Cited

U.S. PATENT DOCUMENTS 4,842,992  6/1989  Arai ........................................ 430/328

FOREIGN PATENT DOCUMENTS 7-44818   2/1995  Japan .
8-17016   1/1996  Japan .
10-83515  3/1998  Japan .

OTHER PUBLICATIONS

Japanese No. 4–78982, Mar. 12, 1992, First page which corresponds to U.S. Patent No. 4,842,992.

*Primary Examiner*—Christopher G. Young
*Attorney, Agent, or Firm*—Nixon Peabody LLP; David S. Safran

[57] ABSTRACT

A process for curing a resist in which a resist is cured quickly and with high efficiency without gas, which is formed by irradiation with electron beams with which the resist is irradiated for curing, remaining in it and thereby increase its thermostability, is achieved by the following process steps:

a first, the resist is irradiated with electron beams and kept at a temperature such that gas is produced and released in the resist, but no gas bubbles are formed in the resist;

second, the resist is heated so that the gas produced in the first process step is dissipated to the outside from the resist; and third, the resist is irradiated with electron beams so that macromolecules are formed in the resist and the resist is cured.

7 Claims, 4 Drawing Sheets

PROCESS FOR INCREASING THERMOSTABILITY OF A RESIST THROUGH ELECTRON BEAM EXPOSURE

BACKGROUND OF THE INVENTION

1. Field of the Invention

The invention relates to a process for increasing the thermostability of a resist pattern which has been formed on a workpiece, such as a wafer or the like, in a semiconductor production process and an intercoil insulation layer of a magnet head which is used for a magnetic recording device.

2. Description of Related Art

In conventional resist treatment, between the process of developing the resist in which a pattern, such as a circuit or the like, is formed by lithography, and the process of etching and ion implantation using the above described pattern, treatment is performed in which the resist is cured, and thus, its thermostability and etching resistance are increased.

For this curing, the resist was heated and irradiated with UV radiation; this is described, for example, in Japanese patent specification HEI 4-78982. In the example described therein, the main polymer (resin) of the resist is subjected to a macromolecule-forming reaction, such as polymerization, crosslinking or dimerization, and is cured by UV radiation and heating. As a result, the thermostability and etching resistance of the resist were increased.

There are certain types of resists which acquire an advantageous electrical insulation property by curing. Recently, there have been those cases in which, using this circumstance, the resist is used as an insulating layer when a magnet head to be used for a magnetic recording device (for example, a hard disk in a PC) is produced. The magnet head consists, fundamentally, of a core and a coil. The intercoil insulation layer is used to ensure insulation between the lines of the coil. If a resist is used for this intercoil insulation layer, there is the advantage that production of the magnet head is simplified because, for example, a predetermined pattern can be formed by lithography. One such example is described in published Japanese patent application nos. HEI 7-44818, HEI 8-17016 and HEI 10-83515. Also, the curing of this resist for the intercoil insulation layer was performed in the same way as described above, i.e., by UV radiation and heating.

On the other hand, as a process for curing the resist, a new process has been recently proposed in which the resist is irradiated with electron beams. In the conventional UV irradiation, the UV radiation reaches only the area which is a few microns away from the workpiece surface. Therefore, it was impossible to use conventional UV irradiation for a thick workpiece. This irradiation with electron beams yields the advantage that the electron beams penetrate sufficiently into the interior of the resist with a large layer thickness and the main component of the resist can be subjected to a macromolecule-forming reaction and thus cured, because the electron beams have higher energy than UV radiation.

In conventional heat treatment the temperature of the workpiece had to be raised to roughly 250° C. But, irradiation with electron beams prevents the workpiece temperature from rising. Therefore, there is the advantage that this method can be used for a workpiece which is heat-sensitive. As a result, it is expected that curing of the resist by irradiation with electron beams would be used in practice.

But if in fact, a resist is irradiated with electron beams and it is cured, there are cases in which sudden gas development within the resist occurs and the resist is cured in a state in which the gas remains within the resist because the energy of the electron beams is high.

The reason for formation of this gas in the case of a photoresist could be the following:

sudden reaction of a resist radical which is exposed to the action of exposure light by the electron beams, reaction of the resist with HMDS (hexamethyldisilazane) and an antireflection agent which is applied to the wafer; this is done as pretreatment of the resist application;

reaction of the resist filler material, reaction of the solvent which remains in the resist.

In the case of a negative electron beam resist, the area irradiated with the electrons beams is cured. But, there are electron beam resists of the negative type which have azide radicals. In such a case, nitrogen is formed by the irradiation with electron beams.

Moreover, there are cases in which some of the resist resin is decomposed by the electron beams and volatile substances, such as methane, ethane and the like, are formed.

When these causes of gas formation are present in the resist, the curing of the resist progresses by the radiated electron beams. At the same time, the high energy of the electron beams in the resist causes a decomposition reaction. It can be imagined that gas is formed in this way.

If, in this way, an attempt is made to irradiate the resist with electron beams with an amount of radiation which is sufficient for curing of the resist, the gas formed by decomposition is hardened within the resist as microscopically small bubbles. If the resist is cured in this state in which it contains bubbles, the pattern of a semiconductor wafer is deformed by the bubbles. Furthermore, the resist film detaches or breaks, or the bubbles burst and thus dust is formed. If in an intercoil insulation layer of a magnet head there are bubbles, the property of electrical insulation is adversely affected; this leads to its being unusable.

The origin of the above described gas can be, for example, naphthoquinone azide which is used as a light-sensitive agent for a resist on the basis of phenol novolak which is used very often. The azide radical of the naphthoquinone azide produces nitrogen gas by decomposition. This decomposition reaction is shown in FIG. 1. Furthermore, as resists which contain a light-sensitive agent with azide radicals, besides those based on phenol novolak, there are also those based on styrene.

Since this decomposition reaction progresses extremely rapidly by means of electron beams, it is difficult in treatment of a resist to cure it in such a way that the gas which forms does not remain in the resist.

SUMMARY OF THE INVENTION

Therefore, a primary object of the invention is to devise a process in which a resist is cured quickly and with high efficiency without gas which is formed by irradiation with electron beams when the resist is irradiated with electron beams remaining in the resist when it is cured.

In a process for treatment of a resist in which irradiation with electron beams increases the thermostability of the resist, the above indicated object of the invention is achieved by the following process steps:

first, the resist is irradiated with electron beams and kept at a temperature such that gas is produced and released in the resist, but no gas bubbles are formed in the resist.

second, the resist is heated so that the gas produced in the first process step is dissipated to the outside from the resist; and third, the resist is irradiated with electron beams so that macromolecules are formed in the resist and the resist is cured.

The noted object is also achieved as in accordance with the invention by the heating temperature being raised during the first process step.

The object is moreover achieved according to the invention by the heating temperature being raised during the second process step.

In the following, the process of the invention for treatment of a resist is further described using an embodiment shown in the drawings.

DETAILED DESCRIPTION OF THE INVENTION

Figure 1:
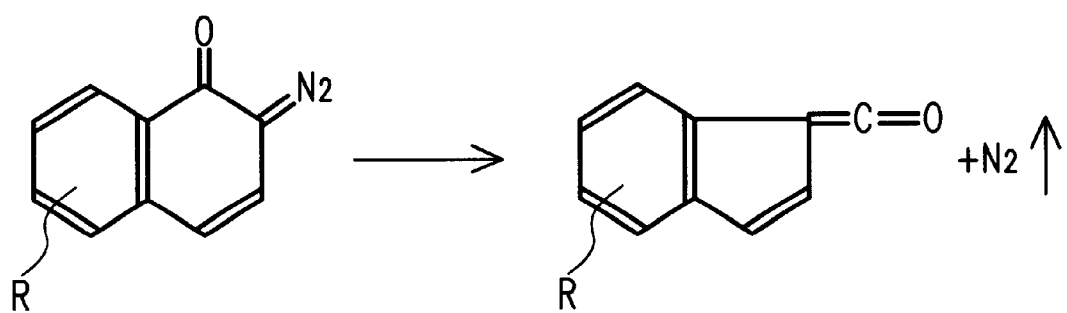
FIG. 1 shows a schematic of the reaction of the light-sensitive agent naphthoquinone azide.
Figure 2:
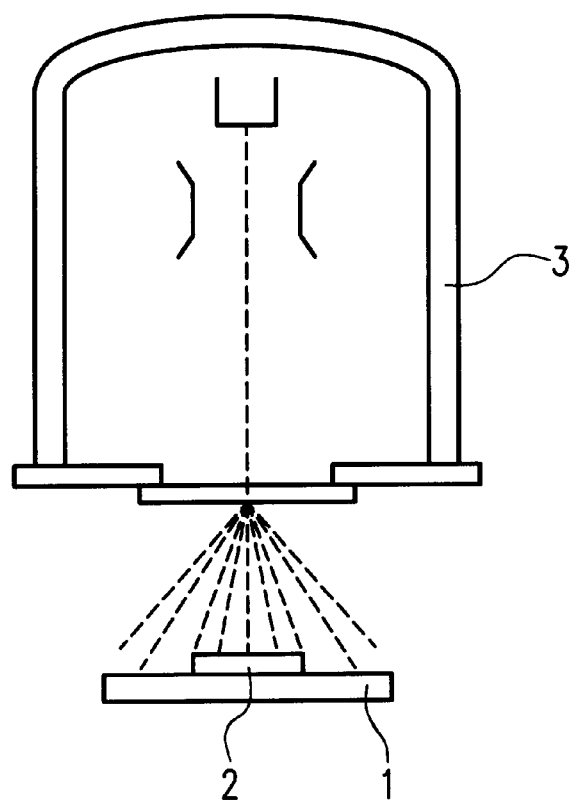
FIG. 2 is a schematic depiction of a device used in one embodiment of the invention.

FIG. 2 shows a device which was used to execute the process of the present invention for treatment of a resist. In FIG. 2, a wafer 1 is shown to which a resist 2 based on phenol novolak in which naphthoquinone azide is used as the light-sensitive agent was applied in a thickness of 10 microns and 20 microns. Above the wafer 1, an electron beam irradiation device 3 was positioned a distance of roughly 20 mm from the wafer, by which the wafer 1 was irradiated with electron beams. A device described in U.S. Pat. No. 5,637,953 can be used for this electron beam irradiation device 3.

Figure 3:
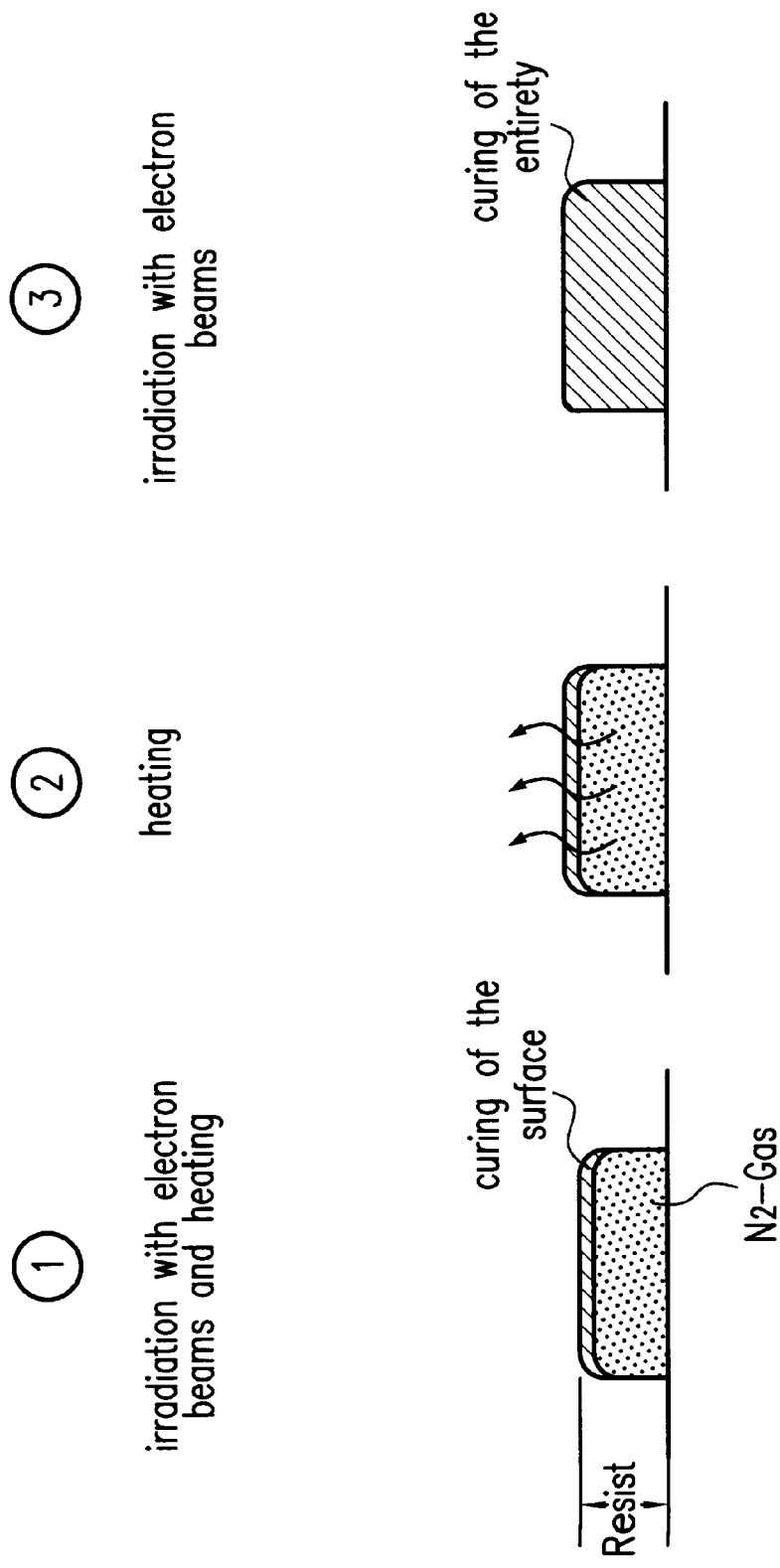
FIG. 3 is a schematic representation of the steps of the process according to the invention for treatment of a resist.

In the following, the steps of a process in accordance with the invention for treatment of a resist is described using FIG. 3. The process of the invention for treatment of a resist has the following three process steps:

(first process step)

The resist is cured by irradiation with electron beams and at the same time is kept at or heated to a temperature at which the gas which forms in this process does not form bubbles. The gas is released to the outside from the resist. This process step is shown at (1) in FIG. 3.

(second process step)

The resist is heated so that the gas remaining in the first process step is released completely to the outside from the resist. This process is shown at (2) in FIG. 3.

(third process step)

The resist is irradiated with electron beams so that, after completion of gas release, macromolecules are formed in the resist and the resist is cured. This process is shown at (3) in FIG. 3.

To confirm the action of the respective process step, the following tests were performed.

In a resist with a layer thickness of 10 microns and a resist with a layer thickness of 20 microns the process steps 1 to 3 were carried out under the following conditions:

In the resist with a layer thickness of 20 microns, those treatments described in process steps 1 to 3 were performed and an evaluation process was carried out to evaluate the results which are shown in Table 1 below.

TABLE 1

| 1st process step | | 2nd process step | 3rd process step | Evaluation process |
|---|---|---|---|---|
| electron beam irradiation | heating | heating conditions | electron beam irradiation | |
| 50 kV | heating at room temp. | room temperature (1–5 hrs heating) | 50 kV | 150° C., |
| 200 µA | | 60° C. heating (1–4 hrs heating) | 200 µA | 3 min. |
| 30 sec. irrad. | | 2 hrs at room temp. and then heating at 60° C. (1–3 hrs heating) | 120 sec. irrad. | heating |
| | | 2 hrs at room temp. and then heating at 60° C. (1 hr) then heating at 80° C. (0.5–1 hr heating) | | |

Furthermore, in a resist with a layer thickness of 10 microns the treatments described in process steps 1 to 3 were carried out. An evaluation process was carried out to evaluate the results which are shown in Table 2 below.

TABLE 2

| 1st process step | | 2nd process step heating conditions | 3rd process step | Evaluation process |
|---|---|---|---|---|
| electron beam irradiation | heating | | electron beam irradiation | |
| 50 kV | heating at room | room temperature. (0.5–2 hrs heating) | 50 kV | 150° C., |
| 200 µA | | | 200 µA | 3 min. |

TABLE 2-continued

| 1st process step | | 2nd process step heating conditions | 3rd process step | Evaluation process |
|---|---|---|---|---|
| electron beam irradiation | heating | | electron beam irradiation | |
| 30 sec. irrad. | temp. | 50° C. heating (0.5–4 hrs heating) 2 hrs at room temp. and then heating at 60° C. (0–2 hrs heating) | 120 sec. irrad. | heating |
| | 85° C. heating | heating at 85° C. | | |

Figure 4:
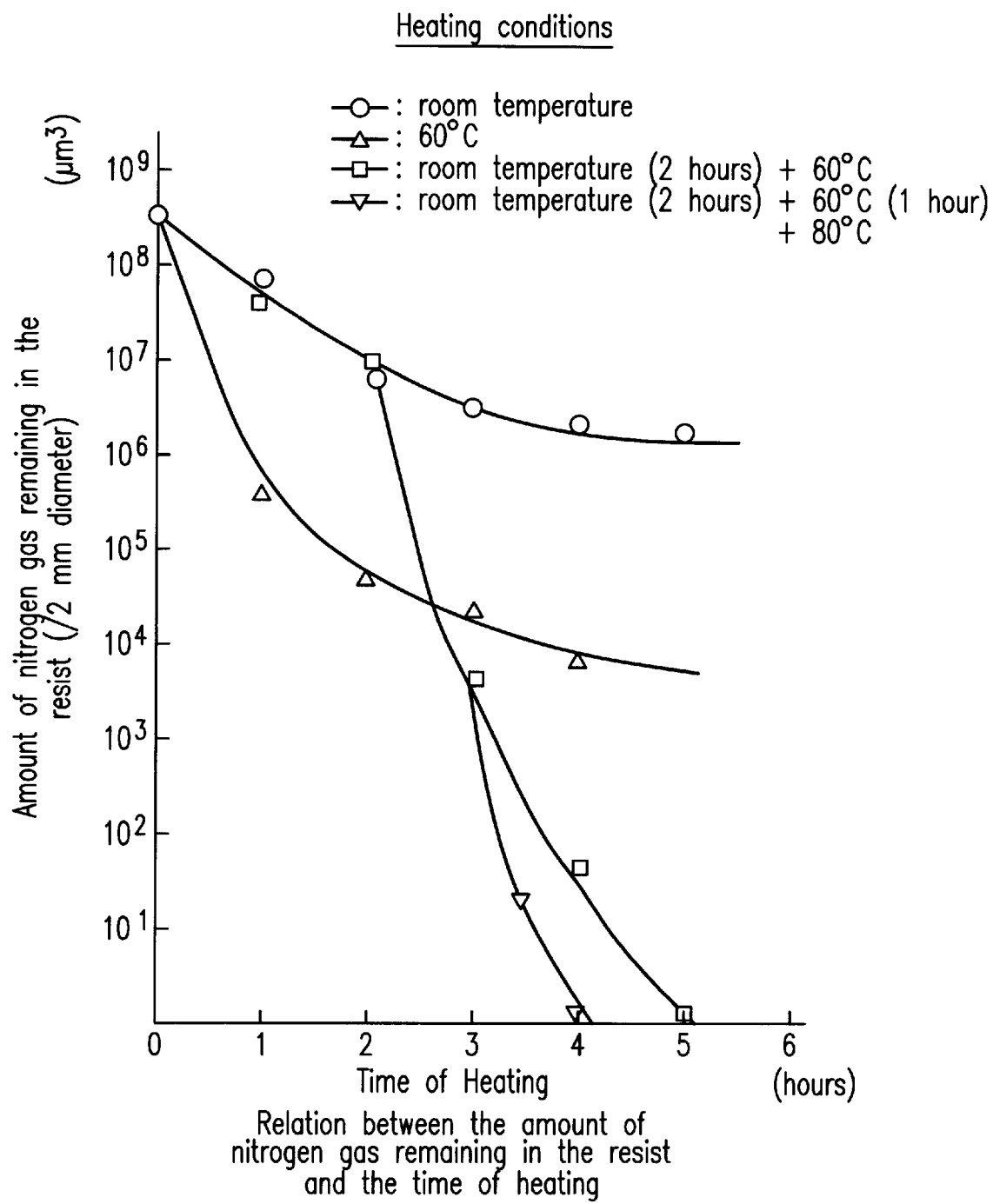
FIG. 4 is a graphic representation of the relation between the temperature conditions and the amount of nitrogen gas remaining in the resist in the second process step for a resist with a layer thickness of 20 microns.

In the evaluation processes, the amount of nitrogen gas remaining in the resist was measured. Here, after completion of the third process step, the sample was heated at 150° C. for three minutes, by which the nitrogen gas remaining in the resist was concentrated in large bubbles. The size and number of bubbles in any area with a diameter of 2 mm were observed with an optical microscope and the amount of gas which was fixed as the amount of nitrogen gas remaining in the resist was computed therefrom. In FIG. 4, the results for a resist with a layer thickness of 20 microns is shown, while in FIG. 5 the results are shown for a resist with a layer thickness of 10 microns. Proceeding from the results of these tests, the respective process step is further described below.
(first process step)

As is shown in FIG. 2, the above described sample 1 is irradiated by the electron beam irradiation device 3 with electron beams, in which the amount of electric charge per unit of area and per second is 30 $\mu A/cm^2$. Irradiation was performed with electron beams with a power of 50 kV and with 200 $\mu A$ for 30 seconds. The energy of the electron beams caused decomposition of the light-sensitive agent in the resist and nitrogen gas was produced. Overall, the resist is in a not yet cured state, although its surface area is cured. This state is shown schematically at (1) in FIG. 3. If in this stage irradiation with a large number of electron beams with a power of 50 kV and with 200 $\mu A$ is done for 120 seconds, the resist is cured in a state in which it contains bubbles of nitrogen gas in the interior. This irradiation with a large number of electron beams is therefore not desirable.

In the first process step, the irradiation with electron beams was performed under the fixed condition of 200 $\mu A$ and the amount of gas remaining in the resist in the cases of a heating temperature of room temperature and 85° C. and a resist layer thickness of 10 microns and 20 microns was measured.

The amount of gas remaining in the resist film for a resist with a layer thickness of 20 microns in the execution of the first process step at room temperature for heating lasting 0 hours is shown in FIG. 4 and is $3.2 \times 10^8$ $\mu m^3$.

Figure 5:
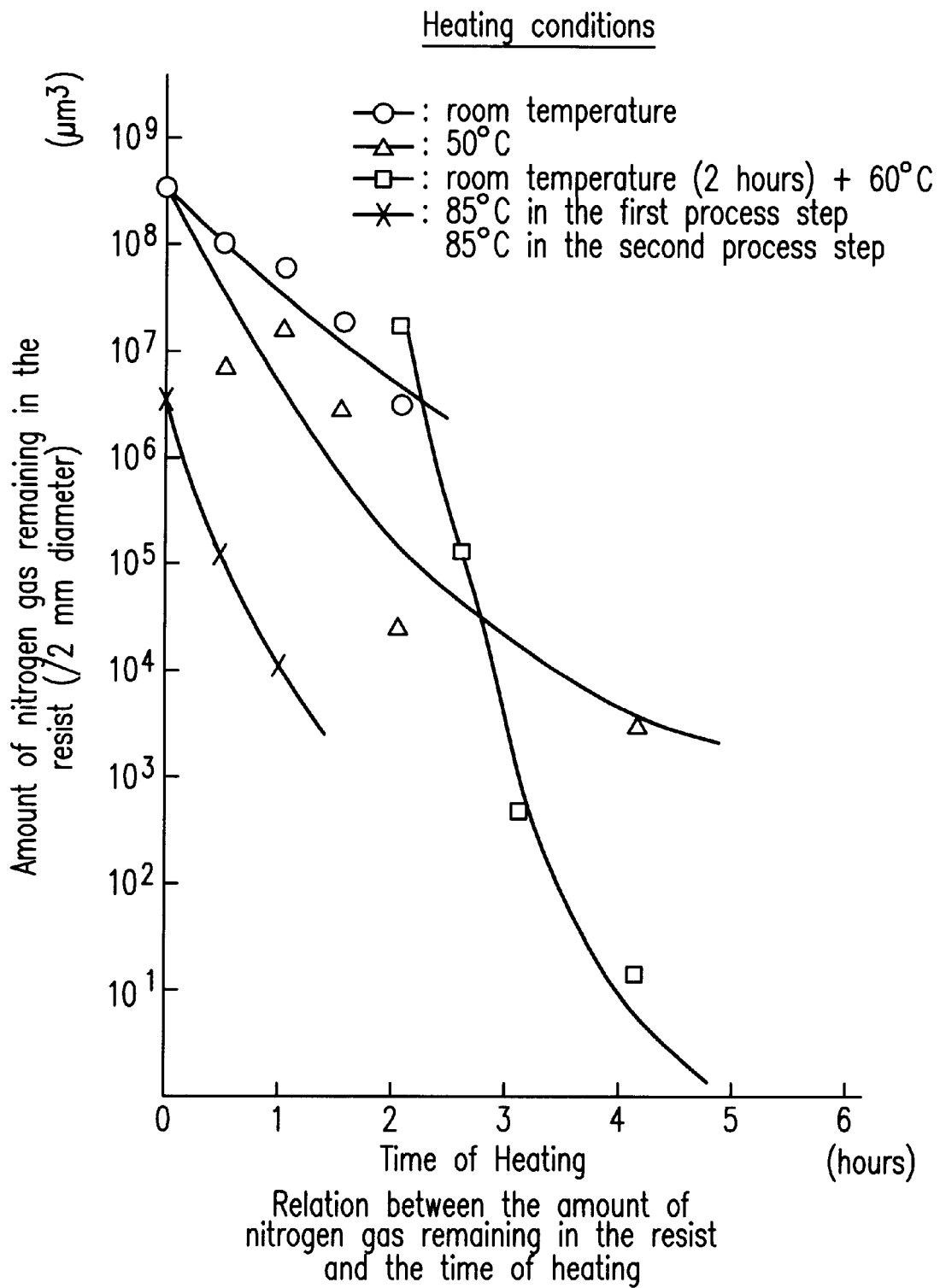
FIG. 5 is a graphic representation of the relation between the temperature conditions and the amount of nitrogen gas remaining in the resist in the second process step for a resist with a layer thickness of 10 microns.

The amount of gas remaining in the resist film for a resist with a layer thickness of 10 microns in the execution of the first process step at room temperature and 85° C. for heating lasting 0 hours is shown in FIG. 5 and is $3.2 \times 10^8$ $\mu m^3$ in the case of room temperature and $4.2 \times 10^6$ $\mu m^3$ in the case of 85° C.

This indicates that, in the first process step, the amount of gas remaining in the resist when heated to 85° C., i.e., when the resist temperature is raised, can be reduced more than at room temperature. When the resist is heated to excess, microscopically small bubbles of nitrogen gas collect in the resist, from which large bubbles form which can no longer escape from the resist and are enclosed in the resist with greater probability.

Therefore, it is necessary to select the degree of heating with sufficient consideration of the types of resists and the application thickness thereof in a temperature range in which no bubble formation occurs.

The amount of irradiation of the electron beams changes depending on the types of resist, the application thickness of the resist, and the like. Therefore, the amount of irradiation must be chosen such that the substance forming the gas contained in the resist, in this embodiment the light-sensitive agent, is sufficiently decomposed and the resulting gas does not remain in the resist. For this reason, it is preferred that the amount of irradiation is essentially roughly 600 $\mu C/cm^2$ to 1800 $\mu C/cm^2$ (C: coulomb).
(second process step)

After the first process step, irradiation of the resist with electron beams is stopped. In the second process step, the wafer is heated. This state is shown schematically at (2) in FIG. 3. In this process step, the nitrogen gas formed in the resist in the first process step is gradually released to the outside from the resist.

In the second process step, the conditions of the heating temperature and the duration of heating were changed and the amount of nitrogen gas remaining in the resist was measured. The amount of irradiation of the electron beams was fixed in another process step, i.e., in the first process step, at 200 $\mu A$ and 30 seconds and in the third process step described below at 200 $\mu A$ and 120 seconds.

FIGS. 4 and 5 illustrate the results, the relation between the temperature conditions and the amount of nitrogen gas remaining in the resist in the second process step being shown. FIG. 4 shows the case of a layer thickness of 20 microns and FIG. 5 the case of a layer thickness of 10 microns.

FIG. 4 shows the result under the following four conditions of duration of heating and temperature in the second process for a wafer with a layer thickness of 20 microns, specifically:

1) when allowed to stand at room temperature
2) when heated to 60° C.
3) when allowed to stand at room temperature for two hours and afterwards heated for one hour to 60° C.
4) when allowed to stand at room temperature for two hours and afterwards is heated for one hour to 60° C. and subsequently heated to 80° C.

1) In the case in which, in the second process step, the wafer was allowed to stand at room temperature, neither in the second nor the third process step could any bubble formation in the resist be ascertained with the naked eye. However, when heated in the evaluation process to 150° C. for three minutes bubble formation was observed. This situation is shown in FIG. 4 by the symbol "o". Here, microscopically small bubbles were formed and were present and they could not be detected with the naked eye.

This phenomenon remained the same even after prolonging the length of time allowed to stand to 5 hours. The nitrogen gas remaining in the cured resist could not be eliminated.

2) In the case of heating the wafer to 60° C. in the second process step, bubble formation was observed with the naked eye. It can be imagined that the bubbles can no longer pass through the network which forms as a result of formation of macromolecules on the resist surface on which by the first process step curing has already started, because the microscopically small bubbles of nitrogen gas collect in the resist and thus large bubbles form. Therefore, by heating over a long time the nitrogen gas remaining in the cured resist could not be removed, as in case 1) at room temperature. Since heating caused the nitrogen gas to be actively released from the resist to the outside, the amount of remaining nitrogen gas was dramatically reduced compared to the case of being allowed to stand at room temperature. This situation is shown in FIG. 4 with the symbol "Δ".

3) In the second process therefore first it was allowed to stand for two hours at room temperature and afterwards heated to 60° C. In this case neither in the second nor the third process step was bubble formation observed. In the evaluation process heating to 150° C. for three minutes was done, no bubble formation having been observed.

In the initial state, i.e., at room temperature, the nitrogen gas was released to the outside through the network on the resist surface on which in part curing had already started.

If in the initial stage of this process the resist is heated, microscopically small bubbles collect in the resist and form large bubbles which can no longer penetrate through the above described network. As a result the nitrogen gas remains in the resist. It is preferred that the temperature of the resist not be overly increased in this initial stage of the process.

The gas formed in the resist is sufficiently released from the latter to the outside as the temperature is kept constant for roughly 2 hours, preventing bubble formation.

Then, the wafer is heated to 60° C. The nitrogen gas formed when allowed to stand at room temperature is for the most part released to the outside. But, heating is performed to drive out the last nitrogen gas still remaining. In this stage, there is hardly any nitrogen gas left in the resist. The amount of nitrogen gas which collects is therefore low, even when heating is performed. Therefore, no large bubbles form, so that there is no disadvantage here. The nitrogen gas remaining in the resist is thus completely released to the outside from the resist.

The nitrogen gas is for the most part released in this way by being allowed to stand for two hours at room temperature. The amount of nitrogen gas formed is low even if heating to 60° C. then takes place. The microscopically small bubbles therefore no longer concentrate, but pass through the network on the resist surface. In the second process step, therefore, no bubbles remain in the resist. Furthermore, by means of heating the remaining nitrogen gas can be driven completely out of the resist. Therefore, no bubble formation occurs even if, for measuring the amount of nitrogen remaining in the resist after the third process step, heating continues for three minutes at 150° C. Therefore, the nitrogen gas remaining in the resist was removed. This situation is shown in FIG. 4 by a "□" symbol. In this way, if the final temperature (60° C.) of the heating temperature in the second process is increased more than the temperature in the first process (room temperature), the resulting gas is effectively driven out of the resist.

4) When heated to 60° C. for one hour after standing for two hours at room temperature in the second process step and with subsequent heating in the second process step to 80° C., neither in the second nor the third process steps could bubble formation be observed. Furthermore, no bubbles were observed in the evaluation process even if at 150° C. heating continued for three minutes. Therefore, the nitrogen gas remaining in the resist was removed. This situation is shown in FIG. 4 with the symbol "∇". The action can be ascertained that in this case the time necessary for curing can additionally be made one hour shorter than in the above described case 3). If in this way the final temperature (80° C.) of the heating temperature in the second process is increased more than the temperature in the first process (room temperature) the resulting gas is effectively driven out of the resist.

This indicates that the action of preventing bubble formation in the resist and at the same time enabling quick release of the resulting nitrogen gas which has formed the resist to the outside can be obtained by increasing the wafer heating temperature during the second process step. In this way the curing time is shortened. This also applies in the heating in the first process step. Since, in the first process step, curing by electron beams and formation of the gas by this curing continue, the resulting gas can be quickly released to the outside from the resist by heating, as in the second process step. Therefore, in the first process step, the time necessary for curing can be shortened by raising the temperature above room temperature.

Under the four heating conditions in FIG. 4, the wafer was heated starting from room temperature. However, if in the first process step irradiation with electron beams and heating are done at the same time, there are also cases in which, proceeding from the heated state, the treatment of the second process step is started. Therefore, it is not absolutely essential to start heating the wafer from room temperature.

FIG. 5 shows the result under the following four conditions of duration of heating and temperature in the second process for a wafer with a layer thickness of 10 microns, specifically:

1) when allowed to stand at room temperature
2) when heated to 50° C.
3) when allowed to stand at room temperature for two hours and afterwards heated to 60° C.
4) after heating to 85° C. in the first process step, also heating to 85° C. in the second process step.

The results of 1), 2) and 3) had essentially the same tendency as in the above described case of a layer thickness of 20 microns.

When according to 4), in the first process step, at the same time, heating is performed to 85° C. for irradiation with electron beams and in the second process step to 85° C., the situation arises which is shown in FIG. 4 by the symbol "x". Here, the action is obtained that the amount of nitrogen gas remaining in the photoresist can be reduced, and at the same time, the time necessary for the second process step can be shortened.

(third process step)

In the state in which the nitrogen gas which had formed in the resist was eliminated by heating in the above described second process step, irradiation is performed with electron beams with the radiation energy which is necessary for curing of the resist. This state is shown schematically in 3) in FIG. 3. Here, the wafer is irradiated for 120 seconds with electron beams with a power of 50 kV and 200 μA and cured. Even if irradiation is performed with these electron beams with the radiation energy which is necessary for the curing of the resist, in the state in which no more nitrogen gas remains, complete curing can be produced because no nitrogen gas remains within the resist. As a result, a cured resist can be obtained without destroying the pattern and a cured resist can be obtained which has a good electrical insulation property as an intercoil insulation layer of a magnet head.

The number of electron beams with which irradiation is in fact to be performed changes depending on the resist type, the thickness of the applied resist, and the like. The amount of irradiation of the electron beams must therefore be selected such that it is sufficient for curing the resist. For this reason, it is preferred that the amount of irradiation with electron beams is essentially roughly 2700 $\mu C/cm^2$ to 5400 $\mu C/cm^2$.

If the above described process steps 1–3 are performed and the wafer treated in this way, the resist can be quickly cured at the same time with high efficiency without the gas which forms by irradiation with electron beams remaining in the resist.

Action of the Invention

In the process according to the invention for curing a resist the latter is treated by the following three process steps:

a first, the resist is irradiated with electron beams and kept at a temperature such that gas is produced and released in the resist, but no gas bubbles are formed in the resist;

second, the resist is heated so that the gas produced in the first process step is dissipated to the outside from the resist; and third, the resist is irradiated with electron beams so that macromolecules are formed in the resist and the resist is cured.

By means of this measure, the curing of the resist can be produced quickly and with high efficiency without the resulting gas remaining within. Furthermore, the action is obtained that the treatment time necessary for curing can be shortened even more if the temperature is raised as the resist is heated.

What is claimed is:

1. Process for treatment of a resist in which the thermostability of the resist is increased by irradiation with electron beams, comprising the following process steps:

first, irradiating the resist with electron beams and keeping it at a temperature such that gas is produced and released in the resist, but no gas bubbles are formed in the resist;

second, heating the resist so that the gas produced in the first process step is dissipated to the outside from the resist; and third, irradiating the resist with electron beams so that macromolecules are formed in the resist and the resist is cured.

2. Process for treatment of a resist as claimed in claim 1, wherein, during the first step, the temperature is higher than room temperature.

3. Process for treatment of a resist as claimed in claim 2, wherein the temperature is raised to 60 to 85° C. during the first step.

4. Process for treatment of a resist as claimed in claim 1, wherein the heating temperature is raised during the second process step.

5. Process for treatment of a resist as claimed in claim 4, wherein the temperature is raised to 60 to 85° C. during the second step.

6. Process for treatment of a resist as claimed in claim 1, wherein the amount of irradiation is 600 $\mu C/cm^2$ to 1800 $\mu C/cm^2$ in the first step.

7. Process for treatment of a resist as claimed in claim 1, wherein the amount of irradiation is 2700 $\mu C/cm^2$ to 5400 $\mu C/cm^2$ in the third step.

* * * * *